(12) United States Patent
Chai et al.

(10) Patent No.: US 11,456,680 B2
(45) Date of Patent: Sep. 27, 2022

(54) OVER-MODULATION PULSE WIDTH MODULATION WITH MAXIMUM OUTPUT AND MINIMUM HARMONICS

(71) Applicant: Hamilton Sundstrand Corporation, Charlotte, NC (US)

(72) Inventors: Huazhen Chai, Caledonia, IL (US); Mustansir Kheraluwala, Lake Zurich, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/244,178

(22) Filed: Apr. 29, 2021

(65) Prior Publication Data

US 2021/0351689 A1 Nov. 11, 2021

Related U.S. Application Data

(60) Provisional application No. 63/021,813, filed on May 8, 2020.

(51) Int. Cl.
*H02M 7/539* (2006.01)
*H02M 1/12* (2006.01)
*H02M 7/5395* (2006.01)
*H02M 1/088* (2006.01)
*H02M 7/537* (2006.01)
(Continued)

(52) U.S. Cl.
CPC ....... *H02M 7/5395* (2013.01); *H02M 1/0025* (2021.05); *H02M 1/088* (2013.01); *H02M 1/12* (2013.01); *H02M 7/537* (2013.01); *H03K 3/017* (2013.01)

(58) Field of Classification Search
CPC ...... H02M 1/12; H02M 1/0025; H02M 1/088; H03K 3/017
See application file for complete search history.

(56) References Cited

U.S. PATENT DOCUMENTS 5,450,306 A * 9/1995 Garces ............... H02M 5/458
363/58
5,623,219 A * 4/1997 Karraker ............ H03C 1/00
327/355

(Continued)

FOREIGN PATENT DOCUMENTS

| EP | 2709261 A1 | 3/2014 |
|---|---|---|
| EP | 3484044 A1 | 5/2019 |
| JP | 2005045846 A | 2/2005 |

OTHER PUBLICATIONS

European Search Report issued in European Application No. 21173123. 7; Application Filing Date May 10, 2021; Dated Sep. 7, 2021 (8 pages).

(Continued)

*Primary Examiner* — Yusef A Ahmed
(74) *Attorney, Agent, or Firm* — Cantor Colburn LLP

(57) ABSTRACT

A power system includes an inverter that convert a DC voltage to a three-phase alternating current (AC) voltage. One or more switch drivers generate a pulse width modulation (PWM) drive signal that drives the inverter. The power system further includes a controller that determines a modulation index associated with the PWM drive signal and injects a harmonic into the PWM drive signal in response to the modulation index exceeding a modulation index threshold value.

4 Claims, 6 Drawing Sheets

(51) Int. Cl.
*H03K 3/017* (2006.01)
*H02M 1/00* (2006.01)

(56) References Cited

U.S. PATENT DOCUMENTS

| | | | | |
|---|---|---|---|---|
| 6,014,497 A * | 1/2000 | Kerkman | .......... | H02M 7/53875 388/811 |
| 6,023,417 A * | 2/2000 | Hava | ................ | H02M 7/53875 318/811 |
| 6,154,378 A | 11/2000 | Peterson et al. | | |
| 6,757,185 B2 | 6/2004 | Rojas Romero | | |
| 7,308,192 B2 * | 12/2007 | Williams | .......... | H02M 7/53875 318/811 |
| 7,545,110 B2 | 6/2009 | Williams et al. | | |
| 8,441,820 B2 | 5/2013 | Shen et al. | | |
| 8,471,518 B2 | 6/2013 | Nishiguchi et al. | | |
| 9,236,828 B1 | 1/2016 | Wei et al. | | |
| 10,027,126 B2 | 7/2018 | Liu et al. | | |
| 10,541,602 B2 * | 1/2020 | Wang | ................ | H02M 7/53873 |
| 10,784,797 B1 * | 9/2020 | Sedano | ................ | H02M 1/08 |
| 2010/0110743 A1 * | 5/2010 | Yamasaki | .......... | H02M 7/53873 332/109 |
| 2010/0134053 A1 * | 6/2010 | Yamada | ................ | H02P 27/08 318/162 |
| 2011/0025240 A1 * | 2/2011 | Furukawa | .......... | H02M 7/5395 318/400.3 |
| 2011/0193509 A1 * | 8/2011 | Ooyama | ................ | H02P 6/28 363/40 |
| 2011/0227515 A1 * | 9/2011 | Imura | ................ | H02P 21/0003 318/400.01 |
| 2011/0241583 A1 * | 10/2011 | He | .......... | H02P 27/08 318/400.09 |
| 2011/0241584 A1 * | 10/2011 | He | ................ | H02P 21/0089 318/400.09 |
| 2011/0266992 A1 * | 11/2011 | Nishiguchi | ............. | H02P 27/08 318/807 |
| 2014/0077738 A1 * | 3/2014 | Iwaji | ................ | H02P 27/08 318/400.36 |
| 2014/0225547 A1 * | 8/2014 | Yokozutsumi | ........... | H02P 6/14 318/722 |
| 2016/0144871 A1 | 5/2016 | Jalla | | |
| 2016/0233801 A1 * | 8/2016 | Sakai | ................ | H02P 6/06 |
| 2016/0308460 A1 * | 10/2016 | Lee | .......... | H02M 7/44 |
| 2016/0308465 A1 * | 10/2016 | Yoo | ................ | H02J 3/383 |
| 2017/0133960 A1 * | 5/2017 | Takahashi | ............. | H02P 25/022 |
| 2018/0226913 A1 * | 8/2018 | Hatakeyama | ......... | H02M 1/084 |
| 2019/0165715 A1 * | 5/2019 | Hoshino | ................ | H02M 7/48 |
| 2020/0373854 A1 * | 11/2020 | Tanaka | ............. | H02M 7/53871 |
| 2021/0152101 A1 * | 5/2021 | Tsuruma | ................ | H02M 1/42 |

OTHER PUBLICATIONS

Saher et al., "Minimizing total harmonic distortion of a two-level voltage source inverter using optimal third harmonic injection" IEEE Transactions on Power Electronics 35.3 (Jul. 2019) pp. 3287-3297.

* cited by examiner

US 11,456,680 B2

OVER-MODULATION PULSE WIDTH MODULATION WITH MAXIMUM OUTPUT AND MINIMUM HARMONICS

CROSS-REFERENCE TO RELATED APPLICATIONS

This application claims priority to U.S. Provisional Application Ser. No. 63/021,813, filed May 8, 2020, the contents of which are incorporated by reference herein in its entirety.

BACKGROUND

Exemplary embodiments are generally related to electrical power systems and more particularly, to power systems for supplying power to an aircraft motor.

Aircraft power systems commonly employ inverters to convert direct current (DC) power to alternating current (AC) for driving a load such as, for example, a motor. A DC link provides a DC input voltage (typically referred to as the "DC link voltage") to the inverter. However, the output voltage of the inverter using sinusoidal modulation signal has a limited output voltage from an available DC link voltage. Therefore, one or more additional voltage signals can be combined with the sinusoidal modulation signal to increase the inverter output voltage above the maximum available voltage associated with a sinusoidal modulation signal, which in turn introduces additional harmonics (e.g., third and fifth harmonics) into the inverter output voltage.

BRIEF DESCRIPTION

According to a non-limiting embodiment, a power system includes a power source configured to generate a direct current (DC) voltage, and an inverter in signal communication with the power source. The inverter is configured to convert the DC voltage to a three-phase alternating current (AC) voltage. At least one switch driver is configured to generate a pulse width modulation (PWM) drive signal that drives the inverter. A controller is in signal communication with the inverter. The controller is configured to determine a modulation index associated with the PWM drive signal and inject a harmonic into the PWM drive signal in response to the modulation index exceeding a modulation index threshold value.

According to another non-limiting embodiment, a method of supplying power to a load comprises generating a direct current (DC) voltage, and converting, via an inverter, the DC voltage to a three-phase alternating current (AC) voltage. The method further comprises generating, via at least one switch driver, a pulse width modulation (PWM) signal that drives the inverter, and determining, via a controller, a modulation index associated with the PWM drive signal. The method further comprises injecting a harmonic into the PWM drive signal in response to the modulation index exceeding a modulation index threshold value.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As previously noted, additional voltage signals referred to as "harmonics" can be added to a conventional fundamental sine wave component of an output modulation signal to increase the inverter fundamental output voltage from a given DC link voltage. When using PWM scheme, the modulation index (mi) of the inverter effectively establishes the inverter fundamental output voltage. More specifically, the modulation index is the ratio of the peak of a modulating signal or fundamental signal component to the peak of a higher frequency carrier signal, which is typically a triangle wave. The maximum modulation index is typically set to 1.00 per unit. The inverter fundamental output voltage will not saturate while the modulation index remains in a range of 0.0 to 1.0. The inclusion of additional harmonics, however, can increase the inverter fundamental output voltage without necessarily causing saturation, but at the expense of additional losses, along with increased size, weight and/or deterioration in the performance of the load (e.g., motor). Conventional solutions have aimed to either maintain a fixed triplen harmonic to fundamental ratio resulting in the excessive losses, or to inject less amount of the third harmonic which limits the ability to achieve maximum fundamental voltage output afforded by the DC link.

Non-limiting embodiments of the invention described herein provides a power controller that implements a harmonic injection logic circuit capable of controlling the injection of a third harmonic into a fundamental signal to generate a modulation signal in a manner that achieves the maximum inverter fundamental voltage output that can be obtained from the DC link while minimizing the amount of harmonics introduced into the inverter output voltage. In this manner, a maximum level output AC voltage can be derived from the given DC link voltage while keeping the third harmonic injection to a minimum.

Figure 1:
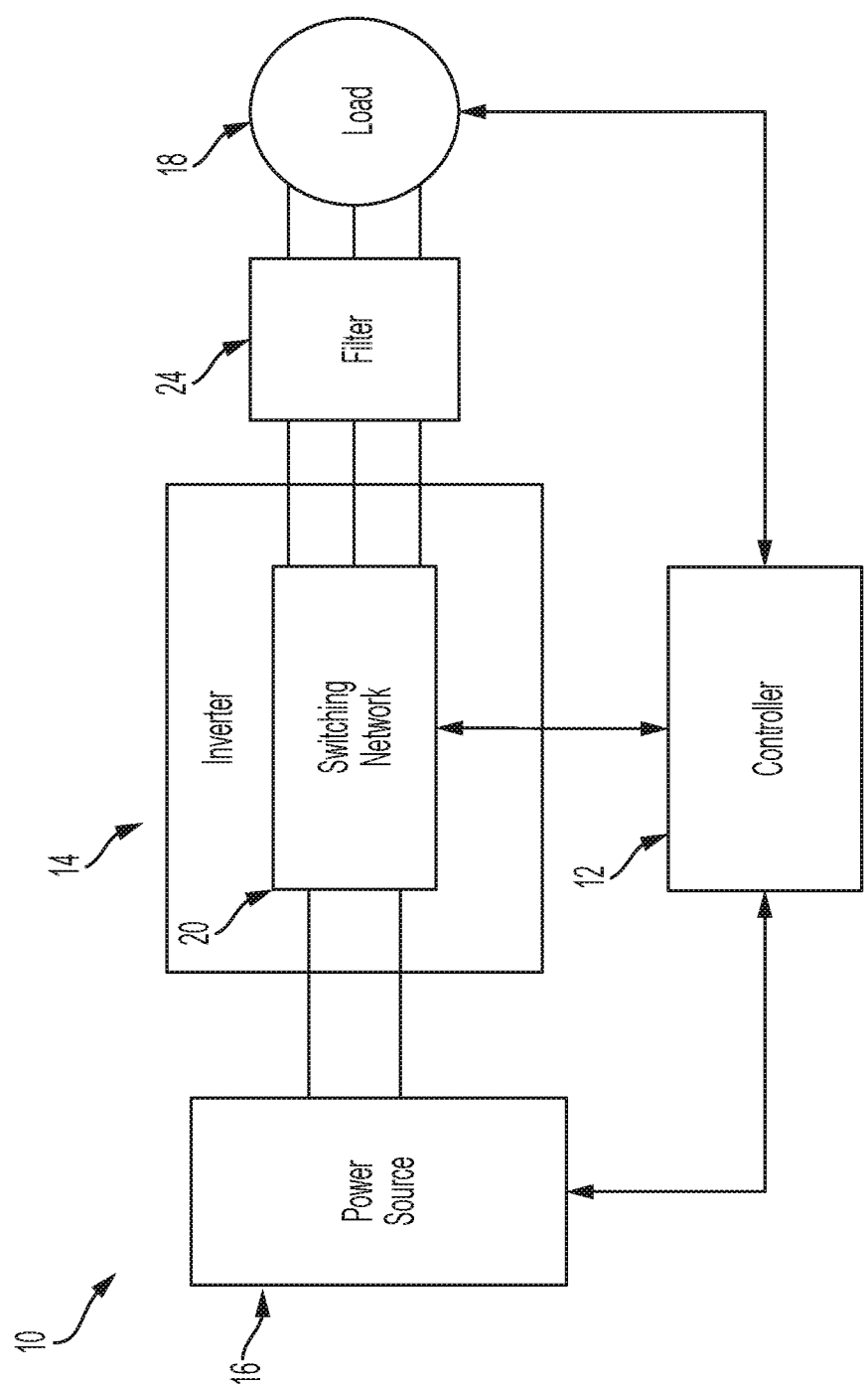
FIG. 1 is a block diagram illustrating a power system according to a non-limiting embodiment.

With reference now to FIG. 1, a power system 10 is illustrated according to a non-limiting embodiment. The power system 10 includes a controller 12, an inverter 14, a power source 16, a filter network 24, and a load 18. The power source 16 can be implemented as a direct current (DC) power source, for example, and the load 18 can be any load that accepts AC (alternating current) power such as, for example, a motor 18. The filter network 24 is configured to suppress higher order harmonics present in the output power generated by the inverter 14. The filter network 24 is also capable of removing the carrier signal from the combined fundamental and harmonic signal, thereby delivering the fundamental signal component and harmonic signal component to the load 18.

The controller 12 is in signal communication with the power source 16, the inverter 14 and the load 18. The controller 12 can include memory and an electronic hardware processor configured to execute algorithms and computer-readable program instructions stored in the memory. Accordingly, the controller 12 can monitor the voltage levels, current levels and/or temperature levels at various nodes of the system 10, and implement various control schemes for operating the power source 16, the inverter 14 and/or the load 18. The controller 12 can also compute the actual voltage levels and current levels and/or expected voltage levels and current levels based on monitored values and models stored in the memory.

The inverter 14 includes a switching network 20. The switching network 20 can be constructed, for example, as a six-switch bridge inverter circuit (not shown in FIG. 1). The states of the switches can be controlled by the controller 12. When the switches of the switching network 20 are implemented as semiconductor switches (e.g., transistors), the controller 12 can include switch drivers (not shown in FIG. 1) that are configured to control the signals applied to the gates of respective transistors. In one or more non-limiting embodiments, the transistors include, but are not limited to, bi-polar transistors, insulated gate bipolar transistors (IG-BTs), and metal-oxide semiconductor field-effect transistors (MOSFETs).

Figure 2:
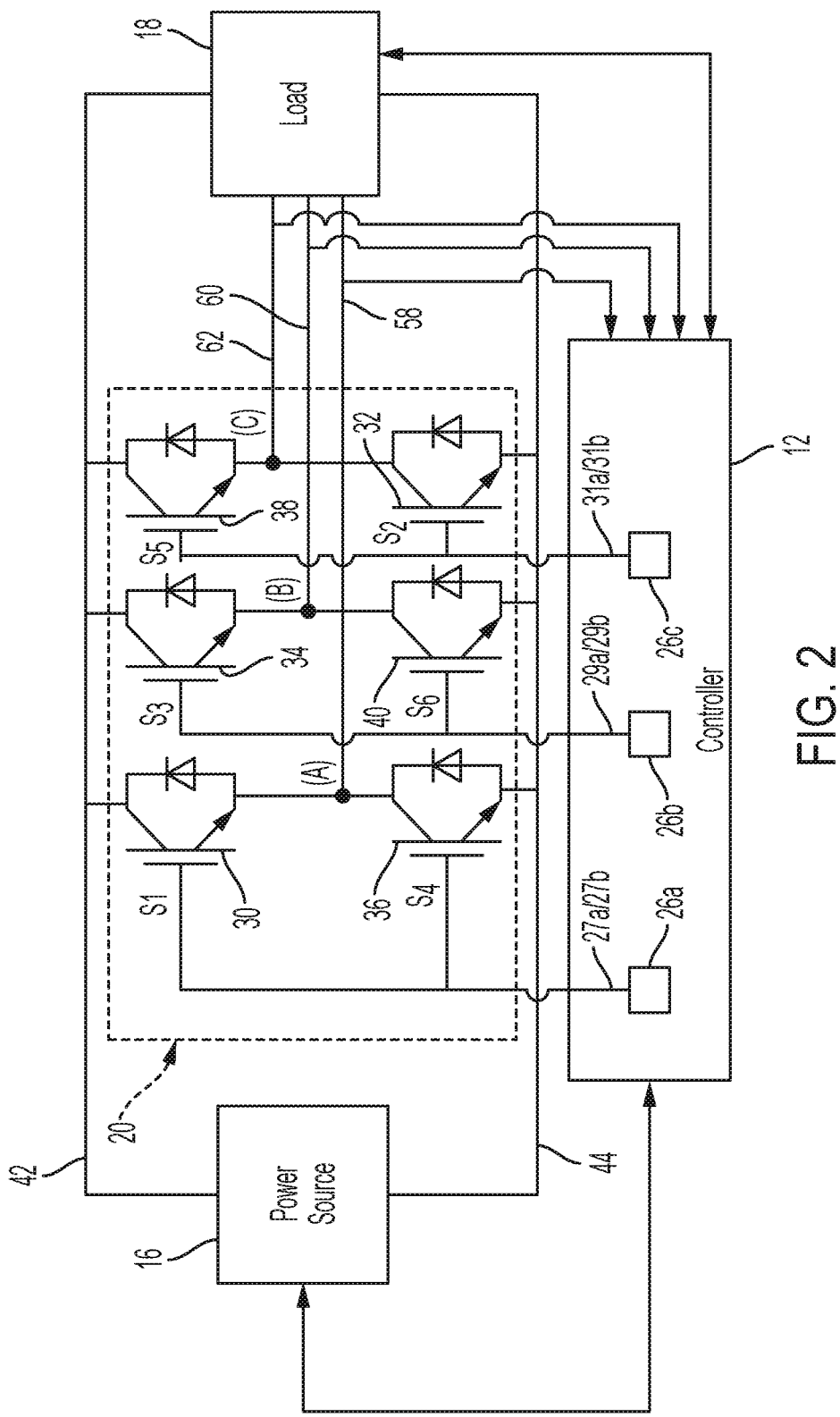
FIG. 2 is a block diagram of an inverter included in a power system according to a non-limiting embodiment.

FIG. 2 illustrates an example of the switching network 20 included in the inverter 14 according to a non-limiting embodiment. The switching network 20 includes a plurality of switches 30, 32, 34, 36, 38, 40, (e.g., transistors S1-S6) connected between a positive rail 42 and a negative (or return) rail 44. The collectors/drains of switches 30, 34, 38 are connected to the positive rail 42 and the emitters/sources of switches 32, 36, 30 are connected to the negative rail 44. The junction or common node (A) of the emitter/source of the switch 30 and the collector/source of the switch 36 is connected to a first phase output line 58 of the inverter switching network 20. The junction or common node (B) of the emitter/source of switch 34 and the collector/source of switch 40 is connected to a second phase output line 60 of the switching network 20. The junction or common node (C) of the emitter/source of switch 38 and the collector/drain of switch 32 is connected to a third phase output line 62 of the switching network 20.

The bases/gates of switches 30, 32, 34, 36, 38, 40 are connected to switch drivers 26a, 26b, 26c to receive output drive signals 27a/27b, 29a/29b and 31a/31b, respectively. In this manner, the controller 12 can control the switches 30, 32, 34, 36, 38, 40 in order to produce three phase, PWM switching patterns on the output lines 58, 60, and 62. Accordingly, the controller 12 can control switches 30, 32, 34, 36, 38, 40 so that the three phase, PWM switching patterns are separated in phase with respect to one another by 120°. Thus, the switching pattern on the second phase output line 60 is displaced in phase by 120° from the switching pattern on the first phase output line 58, and the switching pattern on the third phase output line 62 is displaced in phase by 120° with respect to the switching pattern on the second phase output line 60 and by 240° with respect to the switching pattern on the first phase output line 58. Furthermore, the controller 12, as is known, may control the switches 30 and 36 so that they are not conducting at the same time, may control the switches 34 and 40 so that they are not conducting at the same time, and may control the switches 32 and 38 so that they are not conducting at the same time.

Figure 3:
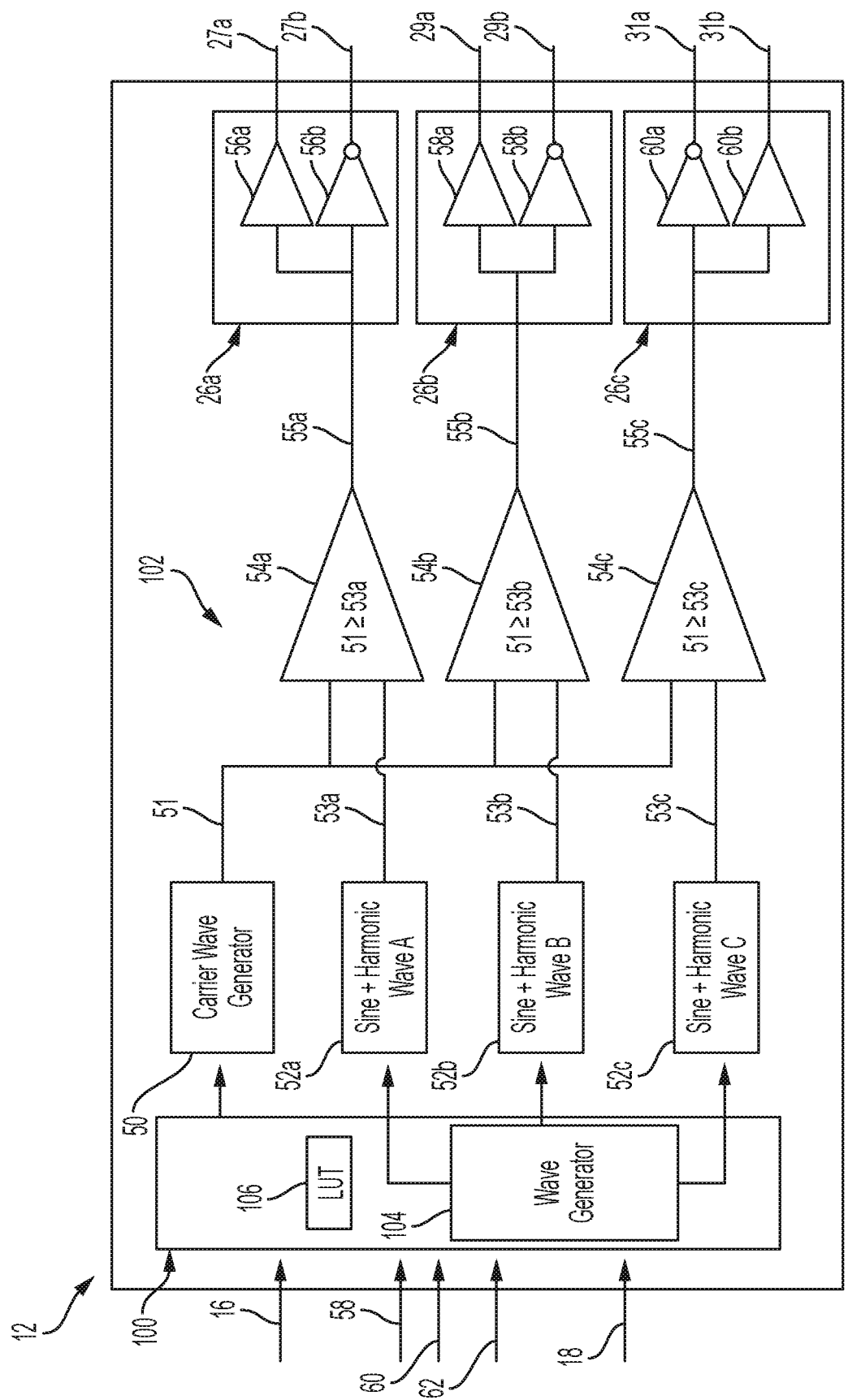
FIG. 3 is a block diagram of a pulse width modulation (PWM) logic circuit implemented in a PWM controller of a power system according to a non-limiting embodiment.

Turning to FIG. 3, the controller 12 is shown in greater detail. The controller 12 includes a modulation index unit 100 and a PWM logic circuit 102. The modulation index unit 100 and PWM logic circuit 102 can be integrated in the controller 12 as shown in FIG. 3, or can be implemented as individual hardware controllers.

The modulation index unit 100 includes a wave generator 104 and a look up table (LUT) 106. The modulation index unit 100 receives input signals from the power supply 16, the load 18, and the first, second and third phase output lines 58, 60, 62. Based on one or more of the input signals 16, 18, 58, 60 and 62, the modulation index unit 100 controls the wave generator 104 to output signals 53a, 53b and 53b. The output signals 53a, 53b and 53b each include a fundamental signal component, and when necessary to achieve an increased targeted power level, also can include a harmonic signal component. In one or more examples, the fundamental signal component is a sine wave and the harmonic signal component is the third harmonic of the sine wave. As mentioned above, the output signals 53a, 53b and 53b are offset in phase from one another by 120 degrees. Once generated, the output signals 53a, 53b and 53b can be modulated with a carrier signal 51 output from carrier wave generator 50. The modulation index unit 100 can control the carrier wave generator 50 to dictate the phase, frequency and/or wave-type of the carrier signal 51. In one or more examples, the carrier signal 51 is a triangle wave.

The carrier signal 51 is delivered to comparators 54a, 54b and 54c. In addition, output signal 53a is delivered to comparator 54a, output signal 53b is delivered to comparator 54b, and output signal 53c is delivered to comparator 54c. When the value (i.e., amplitude) of the carrier signal 51 is greater than the value of output signal 53a, comparator 54a outputs a modulated signal 55a, which includes the carrier signal 51 containing the output signal 53a. When the value (i.e., amplitude) of the carrier signal 51 is greater than the value of output signal 53b, comparator 54b outputs modulated signal 55b, which includes the carrier signal 51 containing the output signal 53b. When the value (i.e., amplitude) of the carrier signal 51 is greater than the value of output signal 53c, comparator Mc outputs modulated signal 55c, which includes the carrier signal 51 containing the output signal 53c.

The modulated signals 55a, 55b and 55c are delivered to control switch drivers 26a, 26b, 26c, respectively. In response to receiving modulated signal 55a, control switch driver 26a outputs a first drive signal 27a via buffer 56a having a first voltage value to switch on (i.e., activate) a corresponding switch (e.g., switch 30) and outputs a second drive signal 27b via inverter 56b having a second voltage to switch off (i.e., deactivate) a corresponding switch (e.g., switch 36). In response to receiving modulated signal 55b, control switch driver 26b outputs a first drive signal 29a via buffer 58a having a first voltage value to switch on (i.e., activate) a corresponding switch (e.g., switch 34) and outputs a second drive signal 29b via inverter 58b having a second voltage to switch off (i.e., deactivate) a corresponding switch (e.g., switch 40). In response to receiving modulated signal 55c, control switch driver 26c outputs a first drive signal 31a via buffer 60a having a first voltage value to switch on (i.e., activate) a corresponding switch (e.g., switch 38) and outputs a second drive signal 31b via inverter 60b having a second voltage to switch off (i.e., deactivate) a corresponding switch (e.g., switch 32).

The modulation index unit 100 further determines the modulation index (mi) and controls the PWM logic circuit 102 to generate output drive signals 27a/27b, 29a/29b and 31a/31b that control the switching network 20 of the inverter 14. Unlike conventional power systems, however, the modulation index unit 100 determines the modulation index required to achieve the power demands of the load 18, and controls the PWM logic circuit 102 to control operation of the switching network to gradually inject a harmonic signal on to the first, second and third phase output lines 58, 60, 62, while at the same time reducing the amplitude of the fundamental signal component present on the first, second and third phase output lines 58, 60, 62. In this manner, the modulation index (mi) can be increased above 1.00 to obtain a maximum differential voltage on the first, second and third phase output lines 58, 60, 62 with a minimum amount of harmonic injected into the phase voltages, or common-mode voltages.

In one or more non-limiting embodiments, the controller 12 determines various parameters based on the input signals from the power supply 16, the load 18, and the first, second and third phase output lines 58, 60, 62. Accordingly, the modulation index unit 100 can calculate the expected modulation index that is required to achieve the desired voltage and current necessary to achieve the changing power demand of the load 18 based on current feedback inputs (e.g., $irec_a$, $irec_b$, and $irec_c$) associated with the first, second and third phase output lines 58, 60, 62. Based in part on the calculated modulation index output from the modulation index unit 100, the PWM logic circuit 102 can control switch drivers 26a, 26b, 26c to generate PWM drive signals 27a/27b, 29a/29b and 31a/31b that are delivered to switches 30, 32, 34, 36, 38, 40 of the inverter switching network 20.

In some non-limiting embodiments, the modulation index unit 100 can calculate the modulation index based on a reference current ($i_{dc\_ref}$), current feedback inputs (e.g., $irec_a$, $irec_b$, and $irec_c$), and phase parameters (e.g., $phase_a$, $phase_b$, and $phase_c$) associated with the first, second and third phase output lines 58, 60, 62. Based on the provided modulation index, fundamental frequency, and switching frequency, the PWM logic circuit 102 can control the switch drivers 26a, 26b, 26c so as to generate the PWM drive signals 27a/27b, 29a/29b and 31a/31b for driving switches 30, 32, 34, 36, 38, 40 of the inverter switching network 20.

As described above, the modulation index unit 100 can determine a modulation index (mi) required to achieve the power demands of the load 18. The modulation index can be defined as the ratio of the peak of a modulating signal or demand fundamental signal component to the peak of a carrier signal. In one or more examples described herein, the fundamental signal component is a sine wave, the harmonic is the third harmonic of the sine wave (i.e., the fundamental signal component), and the carrier signal is a triangle wave. Based on the determined modulation index, the PWM logic circuit 102 controls operation of the switching network 20 to gradually inject the third harmonic on to the first, second and third phase output lines 58, 60, 62, while at the same time reducing the amplitude of the fundamental signal component to generate PWM drive signals 27a/27b, 29a/29b and 31a/3 lb. In one or more non-limiting embodiments, the PWM logic circuit 102 begins to gradually add the third harmonic in response to the modulation index increasing above a modulation index threshold value ranging, for example, from about mi=1.000 to about mi=1.125. However, as the third harmonic is gradually added, the amplitude of the fundamental signal component is gradually decreased according to an optimized curve to avoid saturation.

Figure 4:
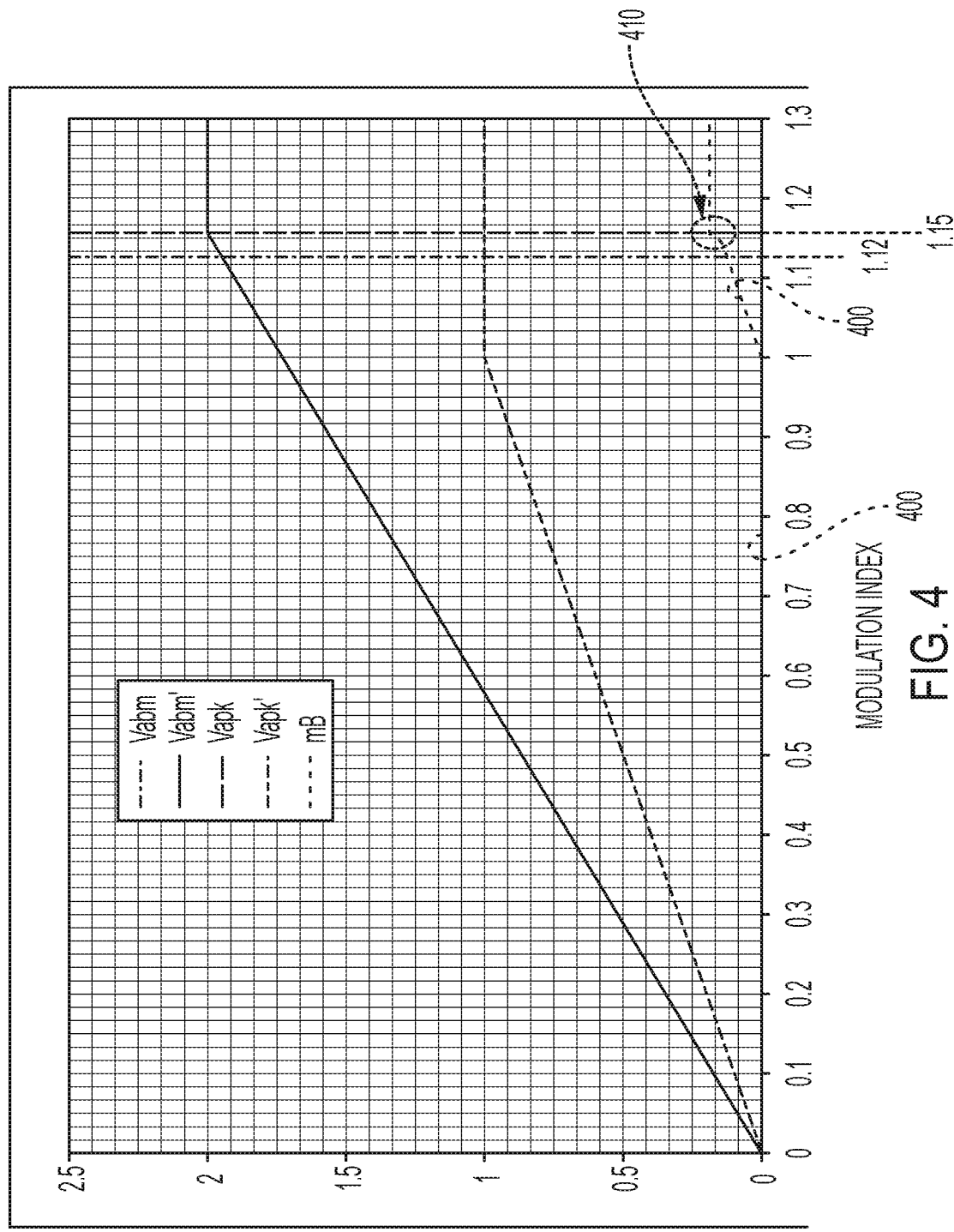
FIG. 4 is a diagram comparing the injection of an added harmonic to a fundamental signal by conventional inverter systems to the injection of an added harmonic to a fundamental signal by a PWM controller according to a non-limited embodiment of the invention.

FIG. 4, for example, illustrates the state of the harmonic 400 (e.g., the third harmonic) generated by switch drivers 26a, 26b, 26c. Unlike conventional power systems which inject a harmonic throughout the entire modulation index (i.e., starting from mi=0.0), the modulation index unit 100 gradually increases the third harmonic in response to determining the modulation necessary to meet load demands exceeds 1.0). More specifically, prior to the calculated modulation index (mi) exceeding 1.00, the harmonic 400 is 0.0. In response to the calculated modulation index exceeding 1.00 (as calculated to satisfy the changing demand of the load 18), the controller 12 controls the switch drivers 26a, 26b, 26c so as to gradually increase the third harmonic 400 added to the PWM drive signals 27a/27b, 29a/29b and 31a/31b. In one or more embodiments of the invention, the gradually increasing harmonic 400 is further optimized at region 410 to achieve the maximum differential voltage achievable by the minimum harmonic injection. Beginning at mi=1.125, for example, the magnitude (i.e., amplitude) of the added third harmonic increases exponential and reaches mi=1.155.

Figure 5:
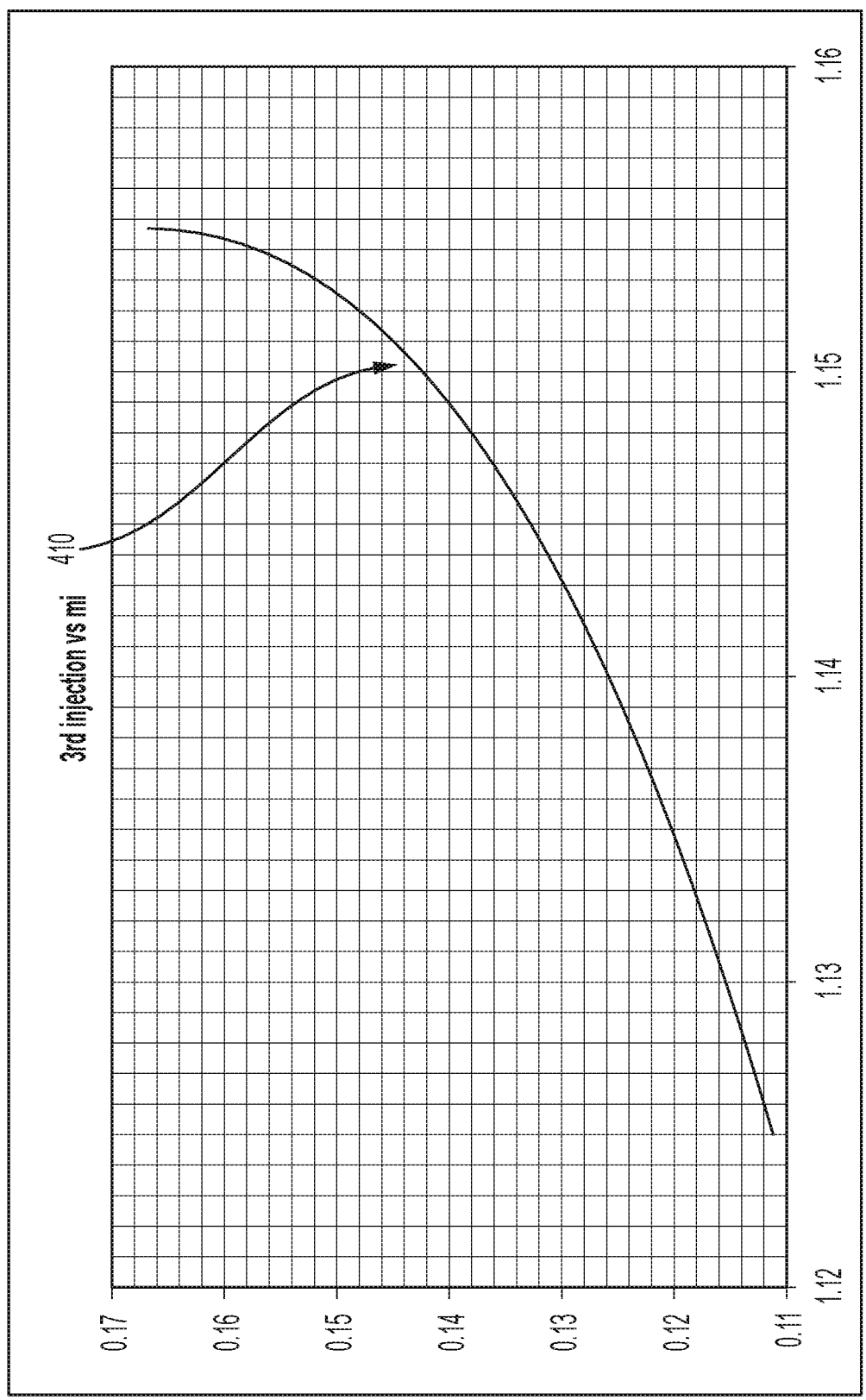
FIG. 5 is a detailed view of a gradually increasing portion of the harmonic added by a PWM controller according to a non-limited embodiment of the invention.

Referring to FIG. 5, the optimized region 410 (e.g., an exponential increasing portion) of the harmonic 400 is produced from about mi=1.125 to about mi=1.155 to achieve the maximum differential voltage achievable using the third harmonic. Between the modulation index range of about 1.125 and about 1.155 (e.g., 1.125<mi<1.155), the third harmonic is optimized at each point such that minimum injection is used to achieve the output voltage necessary to satisfy the demand of the load 18. That is, the modulation index unit 100 optimizes the modulation index when the modulation index exceeds 1.125 and reaches the theoretical maximum, e.g., mi=1.155. In one or more embodiments, the points of the optimized region 410 can be determined using the LUT 106 stored in the modulation index unit 100. In other embodiments, modulation index unit 100 can determine the optimized region 410 analytically. For example, the modulation index unit 100 can compute the optimized region 410 based on an equation:

$$\frac{3}{2(3x|1)\sqrt{\frac{3x+1}{12x}}} \qquad \text{Eq. 1}$$

The value "x" included in the aforementioned equation (Eq.1) is the ratio of third harmonic to the applied fundamental signal component of the PWM signal, which indicates the minimum amount of the third harmonic required in PWM modulation to generate the required output line voltage/current in the optimized region 410, i.e., the region where 1.125<mi<1.155.

Figure 6:
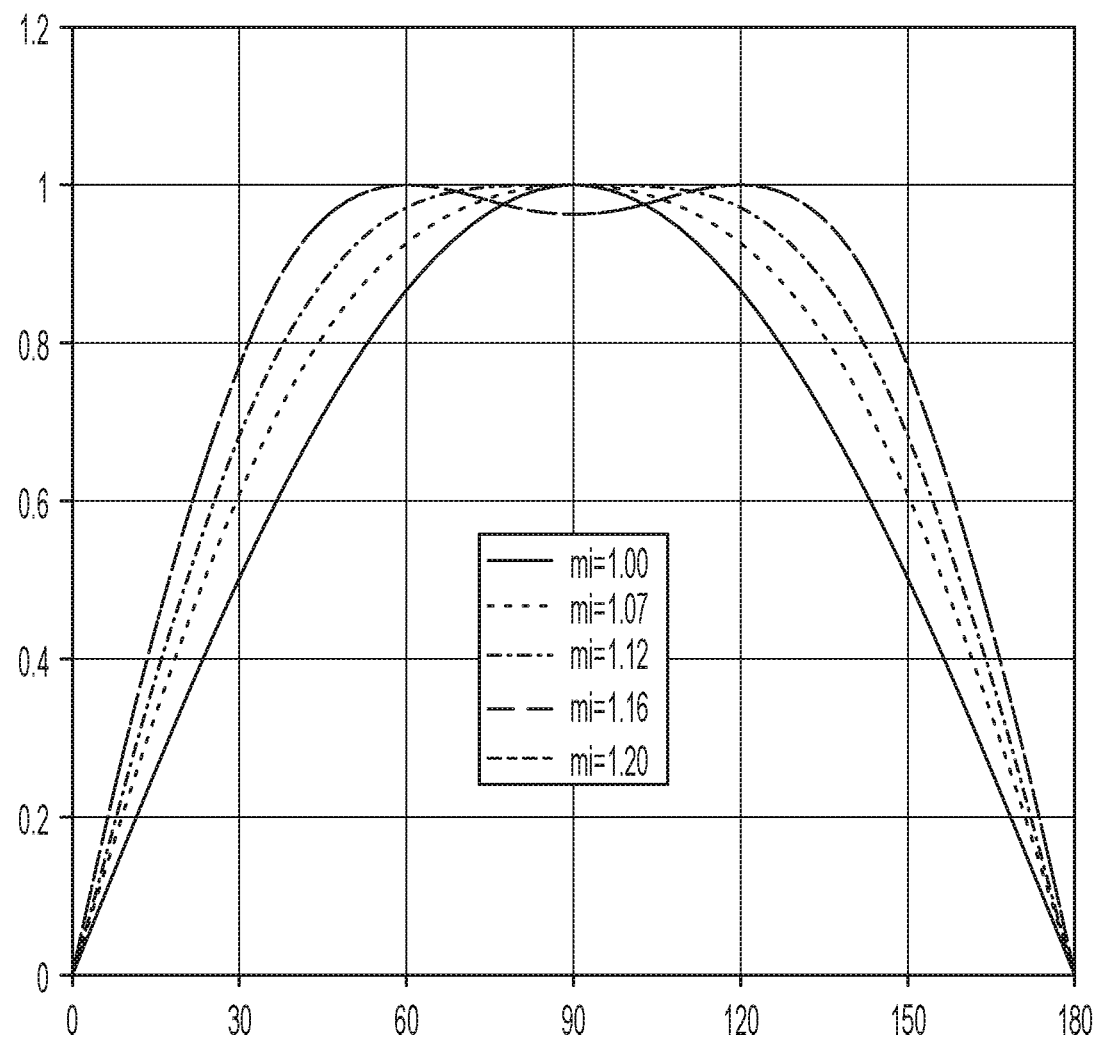
FIG. 6 is a diagram depicting resultant modulation signals generated by a PWM controller at different modulation index values to achieve an output phase differential voltage of about 1.155 according to a non-limiting embodiment of the invention.

The optimization 410 of the injected harmonic 400 facilitates an output differential (line-to-line) voltage of up to 2.0 pu (1.732 if without harmonic injection), which in this example is the maximum differential voltage that can be achieved using a third harmonic. Unlike conventional power systems, however, the actual resulting modulation signal remains below 1.0 as shown in FIG. 6. In this manner, the resulting PWM drive signals 27a/27b, 29a/29b and 31a/31b can achieve an increase of 1.155 times output line-to-line differential voltage without introducing any harmonics in line-to-line differential voltages, and with minimal level of the third harmonic injected in phase to neutral voltages.

As described above, various non-limiting embodiments of the invention described herein provide a power controller that implements a harmonic injection logic circuit capable of controlling the injection of harmonics into a PWM drive signal in a manner that achieves the maximum voltage output potentially achievable with the DC link while minimizing the level of harmonics introduced to the AC output voltages. In this manner, a maximum level of AC voltage can be applied to a load (e.g., motor) while reducing losses, vibration, noise, and deterioration of the load (e.g., motor performance).

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. The term "about" is intended to include the degree of error associated with measurement of the particular quantity based upon the equipment available at the time of filing the application. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. The method operations and/or algorithm(s) recited in the claims can be represented by a flow diagram illustrating the operations, method steps and/or algorithm(s) executed by one or more controllers as described herein. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A power system comprising:
    a power source configured to generate a direct current (DC) voltage;
    an inverter in signal communication with the power source, the inverter configured to convert the DC voltage to a three-phase alternating current (AC) voltage;
    at least one switch driver configured to generate a pulse width modulation (PWM) drive signal that drives the inverter, the PWM drive signal including a fundamental signal component in a form of a sine wave; and
    a controller in signal communication with the inverter, the controller configured to determine a modulation index associated with the PWM drive signal based on a power demand of a load connected to an output of the inverter and to inject a third harmonic of the sine wave into the PWM drive signal in response to the modulation index exceeding a modulation index threshold value that is set at a saturation voltage associated with the PWM drive signal and has a value of about 1.125,
    wherein the controller decreases an amplitude of the fundamental signal component while increasing an amplitude of the third harmonic so as to generate the PWM drive signal, and a total amplitude of the three-phase AC voltage is increased without saturating the fundamental signal component,
    wherein the controller determines an optimization region of the third harmonic from a first modulation index value to a second modulation index value, exponentially increases the amplitude of the third harmonic within the optimization region, and optimizes a plurality of voltage values residing in the optimization region of the third harmonic.

2. The power system of claim 1, wherein the controller determines the optimization to be applied to the plurality of voltage values based on one or both of a look up table (LUT) stored in memory and an analytical computation.

3. A method of supplying power to a load, the method comprising:
    generating a direct current (DC) voltage;
    converting, via an inverter, the DC voltage to a three-phase alternating current (AC) voltage;
    generating, via at least one switch driver, a pulse width modulation (PWM) drive signal that drives the inverter, the PWM drive signal including a fundamental signal component in a form of a sine wave;
    determining, via a controller, a modulation index associated with the PWM drive signal based on a power demand of the load which is connected to an output of the inverter;
    injecting a third harmonic of the sine wave into the PWM drive signal in response to the modulation index exceeding a modulation index threshold value that is set at a saturation voltage associated with the PWM drive signal and has a value of about 1.125;
    decreasing, via the controller, an amplitude of the fundamental signal component while increasing an amplitude of the third harmonic so as to generate the PWM drive signal, and increasing a total amplitude of the three-phase AC voltage without saturating the fundamental signal component in response to increasing the amplitude of the third harmonic;
    determining, via the controller, an optimization region of the third harmonic from a first modulation index value to a second modulation index value, and exponentially increasing the amplitude of the third harmonic within the optimization region; and
    optimizing, via the controller, a plurality of voltage values residing in the optimization region of the third harmonic.

4. The method of claim 3, determining, via the controller, the optimization to be applied to the plurality of voltage values based on one or both of a look up table (LUT) stored in memory and an analytical computation.

* * * * *